United States Patent [19]
Caplin et al.

[11] Patent Number: 5,839,696
[45] Date of Patent: Nov. 24, 1998

[54] MODULAR PAYLOAD ARRANGEMENT

[75] Inventors: Glenn Caplin, Manhattan Beach; James W. Schultz, El Segundo; Romeo Santos, Jr., Los Angeles; Gary M. York, Gardena, all of Calif.

[73] Assignee: Hughes Electronics Corporation, Los Angeles, Calif.

[21] Appl. No.: 577,437

[22] Filed: Dec. 22, 1995

[51] Int. Cl.⁶ .............................. B64G 1/22; B64C 1/06
[52] U.S. Cl. ................ 244/159; 244/158 R; 244/118.2; 244/131
[58] Field of Search ................ 244/158 R, 159, 244/118.1, 118.2, 119, 120, 131, 132

[56] References Cited

U.S. PATENT DOCUMENTS

| | | | |
|---|---|---|---|
| 3,258,225 | 6/1966 | Esch et al. | 244/158 R |
| 4,009,851 | 3/1977 | Cable | 244/158 R |
| 4,771,971 | 9/1988 | Ludwig et al. | 244/158 R |
| 5,036,905 | 8/1991 | Eninger et al. | 244/158 R |
| 5,050,821 | 9/1991 | Kerstein et al. | 244/158 R |
| 5,086,999 | 2/1992 | Mullen | 244/158 R |
| 5,201,481 | 4/1993 | Hararat-Tehrani | 244/121 |
| 5,314,146 | 5/1994 | Chicoine et al. | 244/158 R |
| 5,344,104 | 9/1994 | Homer et al. | 244/158 R |

*Primary Examiner*—V. Lissi Mojica
*Attorney, Agent, or Firm*—Terje Gudmestad; M. W. Sales

[57] ABSTRACT

A modular payload structure providing standardized thermal, electrical and mechanical interfaces. The modular arrangement of the present invention has fixed radiator panels that have standard thermal and mechanical interfaces, allowing communication modules to "plug in" directly to the payload structure. In the case of high thermo-energy dissipating modules, heat pipes on the modules connect to the thermal interfaces and move energy from the modules to the thermal interfaces of the radiator panel.

10 Claims, 2 Drawing Sheets

MODULAR PAYLOAD ARRANGEMENT

BACKGROUND OF THE INVENTION

In a spacecraft, such as a satellite for video data and telephonic communication purposes, a payload structure houses the communication equipment and other supporting equipment. The payload structures are typically custom-designed, depending on the type of mission for which the spacecraft is being deployed. Because these structures can be difficult to mass produce, they are typically hand-made to a great degree.

Traditional payload modules are designed with the bulk of the communications equipment mounted on the surface of the payload's radiator panels, the latter being used to dissipate unwanted heat energy from various heat generating hardware, including the communication modules. Because the communication modules are mounted on the surface of the radiator panels, the number of communication modules that can be used is limited by the size and number of panels.

Other known designs place the radiator panels closer to the center of the payload structure. This is an attempt to improve RF signal transmission by moving the communication modules closer to the satellite's antenna feeds which are located near the center of the payload structure. The result, however, is less interior space within the payload, leaving less room for antennas, propulsion systems and other equipment which are not loaded on the radiator panel side of the spacecraft.

For the above-described payload structures, as with most structures that house communication equipment and other hardware, there is a premium on maximum space utilization. This is especially true with regard to spacecraft payload structures and hardware, where much space is taken up by propulsion systems, power systems and other non-communication equipment.

Accordingly, there is a need for a payload structure that better utilizes space within the structure to house communications equipment. Additionally, there is a need for a payload structure that minimizes the need for custom design, thereby allowing for improved testing and rapid production and buildup of payload structures.

SUMMARY OF THE INVENTION

The present invention achieves the foregoing benefits, along with other features and advantages, by providing a modular payload structure with standardized electrical and mechanical interfaces. The modular arrangement of the present invention may also have fixed panels that have standard thermal and mechanical interfaces, allowing communication modules and other heat generating hardware to "plug in" directly to the payload structure. The fixed panels may be radiator panels from which excess thermal energy may be rejected. In the case of high thermo-energy dissipating modules, such as high power amplifiers or output multiplexers, heat pipes are placed in thermal communication with the modules and move energy from the modules to the radiator panel. Heat pipes may also be placed in thermal communication with other heat generating hardware.

The modular arrangement of the present invention also allows heat generating hardware to be positioned in the volume of the payload structure. Accordingly, more communication equipment and other hardware may be placed within the payload structure, making better use of the interior of the satellite. Placing communication modules within the volume of the spacecraft has other benefits such as moving the units closer to the antenna feeds. Because there is less distance for microwave signals to travel, output loss is minimized and energy efficiency is increased.

Also, the present invention provides for basic functional elements, such as the thermal, electrical, and mechanical interfaces on the modules, to be standardized. Complete payloads may be configured from the plug-in modules, thereby radically reducing the time required to design the payload. Other benefits of the present invention's modular arrangement include allowing for pre-design and pre-build production at a higher level. Also, each module operates separately from other modules, therefore, individuals assembling the modules can build payload structures at a faster rate through greater parallel production. When combined with a deployable radiator, the modular arrangement of the present invention allows for a larger mounted antenna for receiving and transmitting signals, which consequently provides increased gain and cross-polarization performance, and out of coverage suppression. Additionally, the modularity of the present invention allows units to be grouped by function. This is beneficial and creates a better testing environment because each module may be tested separately as the structure is built.

The invention, together with further features and attendant advantages, will be best understood by reference to the following detailed description, taken in conjunction with the accompanying drawing.

DETAILED DESCRIPTION OF THE INVENTION

Figure 1:
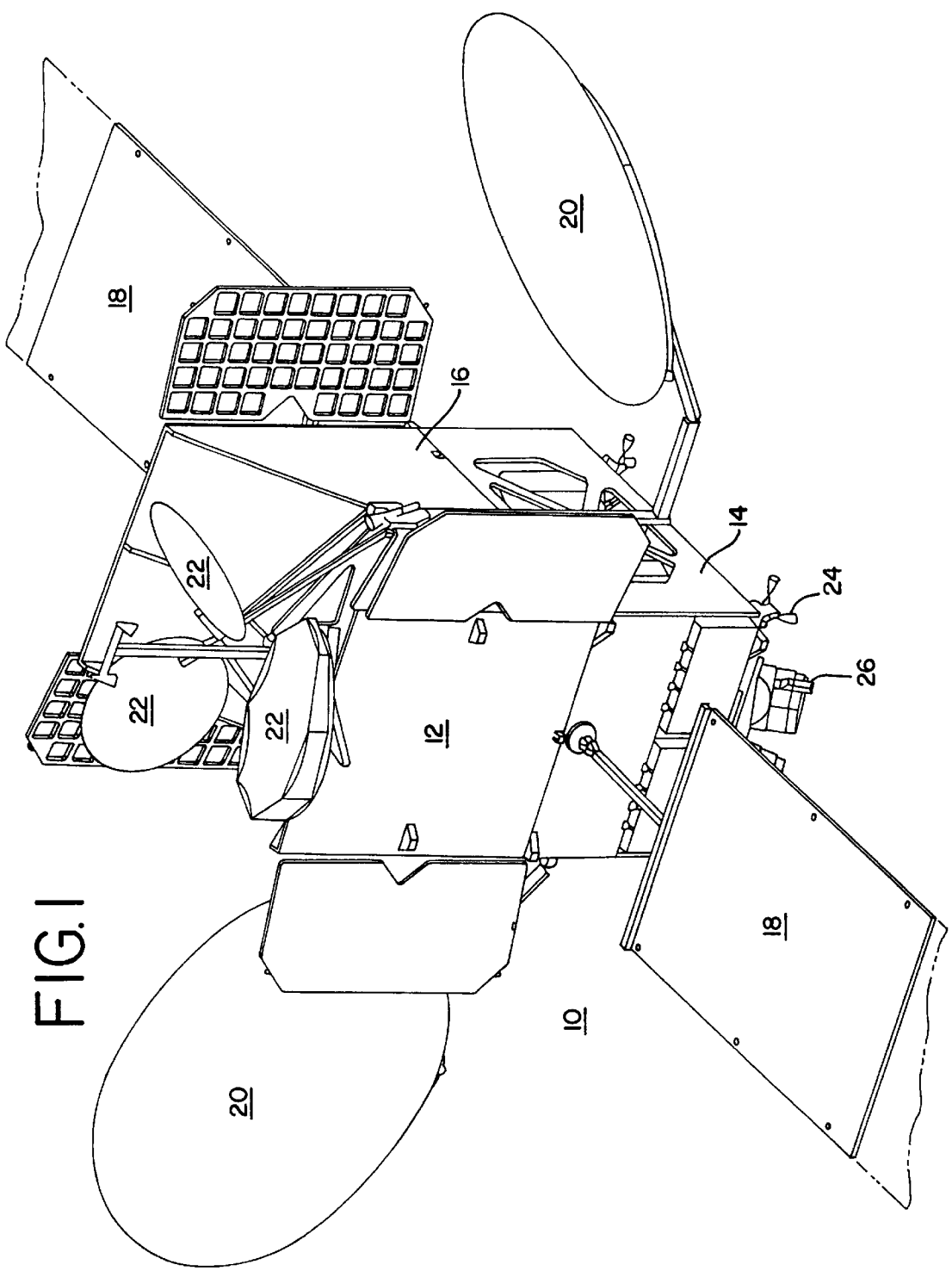
FIG. 1 is a spacecraft or satellite capable of utilizing the present invention.

A spacecraft or satellite 10 capable of utilizing the present invention is shown in FIG. 1. The satellite 10 has a spacecraft body 12 which includes a lower bus module or platform 14 and an upper payload structure 16. Attached to the aft end of the lower bus module 14 are a plurality of engines. These engines include a centrally positioned liquid orbital thruster (not shown), four chemical propulsion engines 24 located at the corners of the bus module 14 and two pairs of xenon ion propulsion engines 26 (one pair shown). Lower bus module 14 contains fuel tanks (not shown) and various power and control modules that operate the engines and power the payload module 16. Bus module 14 further includes a pair of solar panels 18 that convert sunlight into electricity. The electricity is sent to batteries (not shown) located on the bus module 14. Bus module 14 also has a pair of antennae 20, which receive signals from an earth ground station. The antennae 20 reflect the received signals into reflectors 22, which in turn, reflect the signals into receivers (not shown). The antennae 20 are used to control the satellite 10 and to send signals to the ground station.

Payload structure 16 is attached to the bus module 14 and contains a variety of electronic equipment which may contain a number of sensors (not shown). The electronic equipment processes information gathered by the sensors and sends the processed information back to the ground station via antennae 20. The gathered information may concern for example, communications, weather observation, and navigational information.

Figure 2:
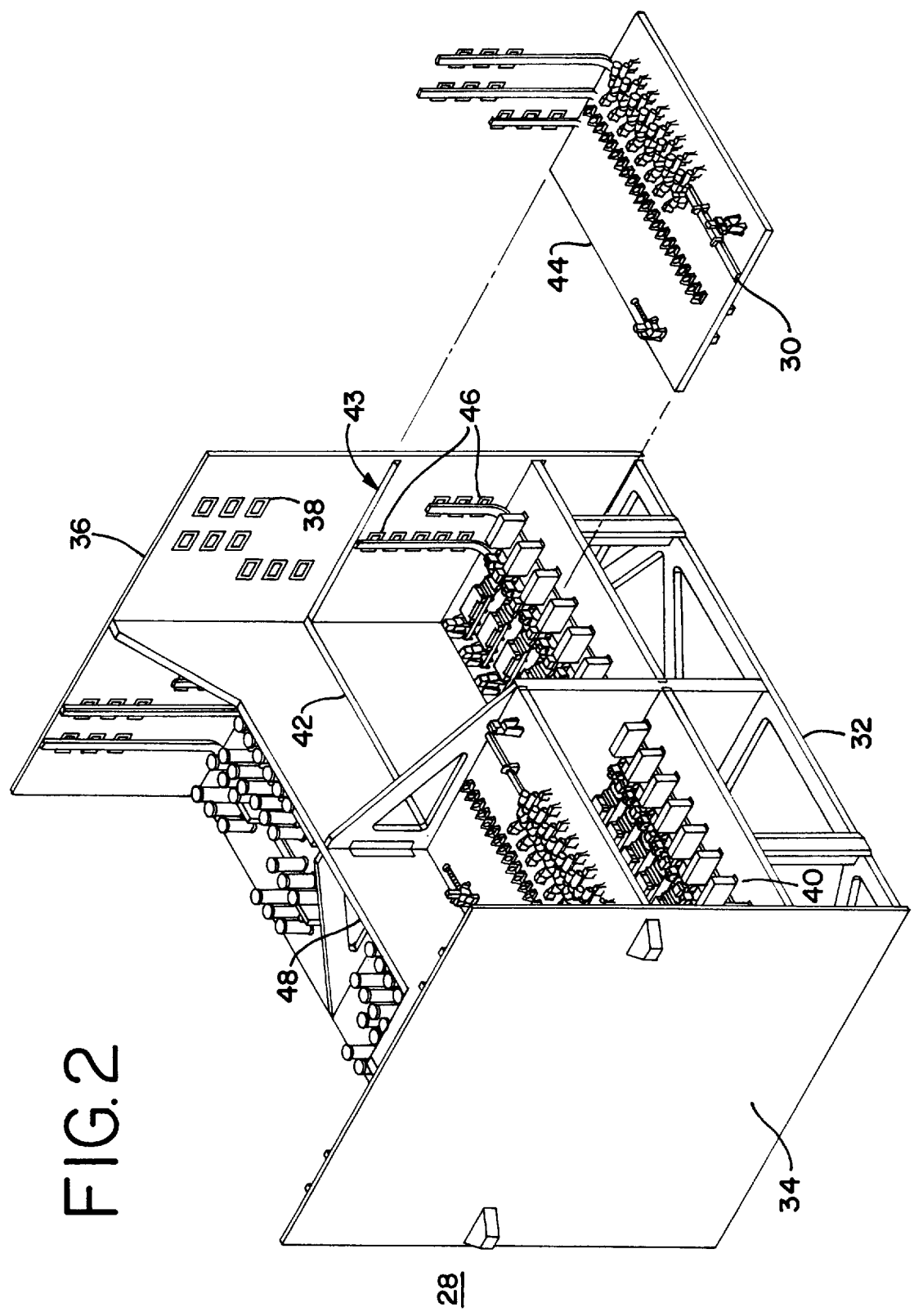
FIG. 2 is an illustration of a modular payload structure and a "plug-in" module, according to a preferred embodiment of the invention.

FIG. 2 is an illustration of a modular payload structure 28, according to a preferred embodiment of the invention. The payload structure 28 is the structural part of a satellite which carries the communications payload. The payload consists of plug-in modules 30 which have mechanical, electrical and thermal interfaces.

For reference purposes herein, the bottom of the payload structure 28, which is substantially rectangular in shape, on which a panel may be placed, shall be referred to as a base 32. The base 32 will adapted to accept removable panels on at least two of its sides. Also, the structure that the panels are affixed to shall be referred to herein as the mid-section piece 48. The payload structure 28 has fixed radiator panels 34, 36 on opposite ends thereof. The fixed radiator panel 36 has a standard thermal interface 38 which provides for the dissipation of heat from heat generating hardware. Higher thermo-energy dissipating units require a means of dissipating waste heat to allow adequate operating temperatures. Higher thermo-energy dissipating units include high power amplifiers 40. Because the two types of high power amplifiers, traveling wave tube and solid state, are both thermally sensitive, the space savings provided by the modular arrangement of the present invention offers greater capacity for carrying these types of modules.

The payload structure 28 and the fixed radiator panel 36, have mechanical interfaces 42, 43 respectively, both of which are adapted to accept a standardized plug-in module. Plug-in module 30 rests on an auxiliary shelf 44. The plug-in module 30 may be a solid-state high power amplifier 40, or another type of known communication module. For these and other high thermo-energy dissipating units, heat pipes 46 run from the plug-in module 30 and connect to the standard thermal interface 38 of the fixed radiator panel 36. Unless otherwise noted, other fixed radiator panels not herein shown are identical to those described herein. The present invention, though, does not preclude mounting equipment, either dissipating or non-dissipating, to the fixed radiator. Optionally, standard electrical interfaces 50 are harnessed along the center panel, or mid-section piece, and fixed radiators. The electrical interfaces 50 provide standard electrical power to telemetry and command interfaces in a manner analogous to a computer backplane bus. Taken together, the standard electrical, thermal and mechanical interfaces allow a modularity of payload elements. This modularity standardization of elements, pre-build, and design independent of other elements, and parallel manufacturing, none of which were allowed under the prior art.

It is therefore intended that the foregoing detailed description be regarded as illustrative rather than limiting, and that it be understood that it is the following claims, including all equivalents, which are intended to define the scope of the invention.

What is claimed is:

1. A modular spacecraft structure, comprising:
    a payload structure having a mechanical interface;
    radiator panel having a thermal interface;
    a shelf adapted to detachably attach to the payload structure at the mechanical interface, the shelf is adapted to have a heat-generating hardware mounted thereon; and
    a heat pipe mounted on the shelf and adapted to detachably, thermally connect the heat-generating hardware to the payload structure and to detachably thermally connect to the thermal interface when the shelf is mechanically attached to the payload structure.

2. A modular spacecraft structure according to claim 1, wherein the payload structure has a first electrical interface and the shelf has a second electrical interface adapted to engage the first electrical interface when the shelf is mechanically attached to the payload structure and to detachably, electrically connect the heat-generating hardware to the payload structure when the shelf is mechanically attached to the payload structure.

3. A modular spacecraft structure according to claim 1, further comprising a module mounted on the shelf, wherein the module detachably mechanically, electrically and thermally connects the heat-generating hardware to the shelf.

4. A modular spacecraft structure according to claim 1, wherein the the heat-generating hardware is detachably mounted on the shelf.

5. A modular spacecraft structure according to claim 1, wherein the the heat generating hardware is an amplifier.

6. A modular spacecraft structure according to claim 1, wherein the heat generating hardware is an output multiplexer.

7. A modular spacecraft structure, comprising:
    a base;
    a first fixed panel, said first fixed panel is a, radiator panel having a thermal interface connected to the base, the first fixed panel having a first mechanical interface adapted to detachably accept a shelf;
    a second fixed panel connected to the base, the second fixed panel having a second mechanical interface adapted to detachably accept the shelf; and
    a center panel connected to each of the base, the radiator panel, and the second fixed panel, the center panel having a third mechanical interface adapted to detachably accept the shelve;
    wherein the shelf has a heat pipe mounted thereon adapted to detachably, thermally connect a heat-generating hardware mounted on the shelf to a payload structure and to detachably, thermally connect to the thermal interface when shelf is detachably accepted by the first, second and third mechanical interfaces.

8. A modular spacecraft structure according to claim 7, wherein the center panel has a first electrical interface and the shelf has a second electrical interface adapted to engage the first electrical interface when the shelf is detachably accepted by the first, second and third mechanical interfaces and to detachably, electrically connect the heat-generating hardware to the center panel.

9. A modular spacecraft structure according to claim 7, wherein the the heat-generating hardware is an amplifier.

10. A modular spacecraft structure according to claim 7, wherein the heat-generating hardware is an output multiplexer.

* * * * *